(12) United States Patent
Wikner

(10) Patent No.: US 7,830,291 B2
(45) Date of Patent: Nov. 9, 2010

(54) FLEXIBLE ANALOG-TO-DIGITAL CONVERTER

(75) Inventor: Jacob Wikner, Linkoping (SE)

(73) Assignee: Zoran Corporation, Sunnyvale, CA (US)

( * ) Notice: Subject to any disclaimer, the term of this patent is extended or adjusted under 35 U.S.C. 154(b) by 225 days.

(21) Appl. No.: 12/279,437

(22) PCT Filed: Jan. 18, 2007

(86) PCT No.: PCT/EP2007/050505

§ 371 (c)(1),
(2), (4) Date: Aug. 14, 2008

(87) PCT Pub. No.: WO2007/093476

PCT Pub. Date: Aug. 23, 2007

(65) Prior Publication Data

US 2009/0207059 A1    Aug. 20, 2009

(30) Foreign Application Priority Data

Feb. 17, 2006  (EP) .................................. 06110104

(51) Int. Cl.
*H03M 1/12* (2006.01)
(52) U.S. Cl. .................. 341/155; 341/154; 341/159
(58) Field of Classification Search .................. 341/154, 341/159

See application file for complete search history.

(56) References Cited

U.S. PATENT DOCUMENTS 6,373,423 B1  4/2002  Knudsen
6,741,194 B1  5/2004  Cassagnes et al.
6,885,236 B2 *  4/2005  Vorenkamp .................. 327/540

(Continued)

FOREIGN PATENT DOCUMENTS

EP    0 729 234 A1    8/1996

OTHER PUBLICATIONS

International Search Report corresponding to PCT/EP2007/050505, mailing date of Jun. 8, 2007.

*Primary Examiner*—Khai M Nguyen
(74) *Attorney, Agent, or Firm*—Lando & Anastasi, LLP

(57) ABSTRACT

An analog-to-digital converter (1). The analog to digital converter (1) comprises a first range-control unit (100) adapted to generate a first range-control value for controlling a size of an input range of the analog-to-digital converter (1). The analog to digital converter further comprises a second range-control unit (200) adapted to generate a second range-control value for controlling a midpoint of the input range. Further, the analog-to-digital converter (1) comprises a reference-level unit (300) operatively connected to the first range-control unit (100) and the second range-control unit (200). The reference-level unit (300) is arranged to generate a plurality of reference levels at least based on the first and the second range-control value. The analog-to-digital converter further comprises a comparison unit (400) operatively connected to the second range-control unit (200) and the reference-level unit (300). The comparison unit (400) is arranged to perform at least one comparison between a difference between an analog input value of the analog-to-digital converter (1) and the second range-control value and individual reference levels of the plurality of reference levels. The comparison unit (400) is further arranged to generate a digital output value of the analog-to-digital converter (1) based on the at least one comparison.

17 Claims, 6 Drawing Sheets

U.S. PATENT DOCUMENTS

| | | | |
|---|---|---|---|
| 6,963,298 B2 * | 11/2005 | Otsuka et al. | 341/155 |
| 7,102,424 B2 * | 9/2006 | Vorenkamp | 327/540 |
| 7,279,960 B1 * | 10/2007 | Lee | 327/538 |
| 2003/0048255 A1 | 3/2003 | Choi et al. | |

* cited by examiner

FLEXIBLE ANALOG-TO-DIGITAL CONVERTER

TECHNICAL FIELD OF THE INVENTION

The present invention relates to an analog-to-digital converter with adjustable input range.

DESCRIPTION OF RELATED ART

An analog-to-digital converter (ADC) is typically used for converting an analog input value of the ADC to a digital output value. An input range of the ADC defines a range of analog input values that may be converted by the ADC. The input range may e.g. be defined in terms of a maximum and a minimum analog input value.

In order to achieve flexibility, it may be desirable to have an adjustable input range of the ADC. Such flexibility may impose hard requirements on components, such as comparators, internally in the ADC. For example, the components may need to be able to handle a variety of common-mode voltages and currents, implying that a high common-mode rejection ratio (CMRR) may be required.

Due to the technology development for fabrication processes for integrated electronic circuits, the allowable supply voltage normally decreases with each new generation of processes. Known circuit topologies with good CMRR may require a higher supply voltage than allowed by a certain fabrication process. As a consequence, it may be difficult to provide A/D conversion with good flexibility in input range.

SUMMARY OF THE INVENTION

It is an object of the present invention to provide an ADC with adjustable input range having an improved flexibility.

According to a first aspect, an analog-to-digital converter comprises a first range-control unit adapted to generate a first range-control value for controlling a size of an input range of the analog-to-digital converter. The analog-to-digital converter further comprises a second range-control unit adapted to generate a second range-control value for controlling a midpoint of the input range. Further, the analog-to-digital converter comprises a reference-level unit operatively connected to the first and the second range-control unit. The reference-level unit is arranged to generate a plurality of reference levels at least based on the first and the second range-control value. The analog-to-digital converter further comprises a comparison unit operatively connected to the second range-control unit and the reference-level unit. The comparison unit is arranged to perform at least one comparison between a difference between an analog input value of the analog-to-digital converter and the second range-control value and individual reference levels of the plurality of reference levels. The comparison unit is further arranged to generate a digital output value of the analog-to-digital converter based on the at least one comparison.

The first range-control value may control a difference between a largest reference level and a smallest reference level of the plurality of reference levels.

An average value of the plurality of reference levels may be proportional to the second range-control value.

The first range-control unit may be digitally controllable via a first control interface of the analog-to-digital converter. The second range-control unit may be digitally controllable via a second control interface of the analog-to-digital converter.

The first range-control unit may include a first MOS transistor, a digital-to-analog converter operatively connected to the first MOS transistor, and a first resistor string. The first range-control unit may be arranged to generate the first range-control value on the gate terminal of the first MOS transistor. The digital-to-analog converter may be arranged to control a drain current of the first MOS transistor. The first MOS transistor may be arranged to inject said drain current into the first resistor string and the first resistor string may be arranged to generate at least one reference value for the second range-control unit.

The second range-control unit may include a multiplexer unit arranged to select one of the at least one reference value generated by the first resistor string. The second range-control unit may be further adapted to output the selected one of the at least one reference value or a value derived therefrom.

The reference-level unit may include a second resistor string arranged to generate the plurality of reference levels at least based on a reference current injected into the second resistor string.

The reference-level unit may further include a second MOS transistor arranged to receive the first range-control value at the gate terminal and to generate the reference current based on the first range-control value.

The reference-level unit may further include an operational amplifier (OP) or operational transconductance amplifier (OTA) arranged to receive the second range-control value at a first input terminal of the OP or OTA. The OP or OTA may further be arranged to supply a control voltage to the gate terminal of a third MOS transistor connected to the second resistor string. A second input terminal of the OP or OTA may be connected to an internal node of the second resistor string.

The comparison unit may include at least one multiplexer unit arranged to select one of the plurality of reference levels and to forward the selected one of the plurality of reference levels to an output terminal of the at least one multiplexer unit.

The at least one multiplexer unit in the comparison unit may include a plurality of MOS transistors arranged to forward one of the plurality of reference levels to the output of the multiplexer unit when set in a conducting state.

Each of the plurality of MOS transistors may be operatively connected to a switch-control unit. Each switch-control unit may be adapted to set the MOS transistor operatively connected to it in the conducting state by connecting a charged capacitor to said MOS transistor.

According to a second aspect, an integrated circuit comprises the analog-to-digital converter.

According to a third aspect, an electronic apparatus comprises the analog-to-digital converter. The electronic apparatus may be, but is not limited to, any of a monitor, a projector, a television set, or a radio transceiver.

It is an advantage that common-mode variations of signals internally in the analog-to-digital converter may be relatively low. Consequently, requirements on common-mode rejection ratio (CMRR) in components internally in the analog-to-digital converter may be relaxed. This is advantageous because it enables a large flexibility in input range of the analog-to-digital converter even in settings where a high CMRR of the internal components is difficult to obtain, such as a setting with a low supply voltage. Further embodiments of the invention are defined in the dependent claims.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of the invention will appear from the following detailed description of the invention, reference being made to the accompanying drawings, in which.

DETAILED DESCRIPTION OF EMBODIMENTS

Figure 1:
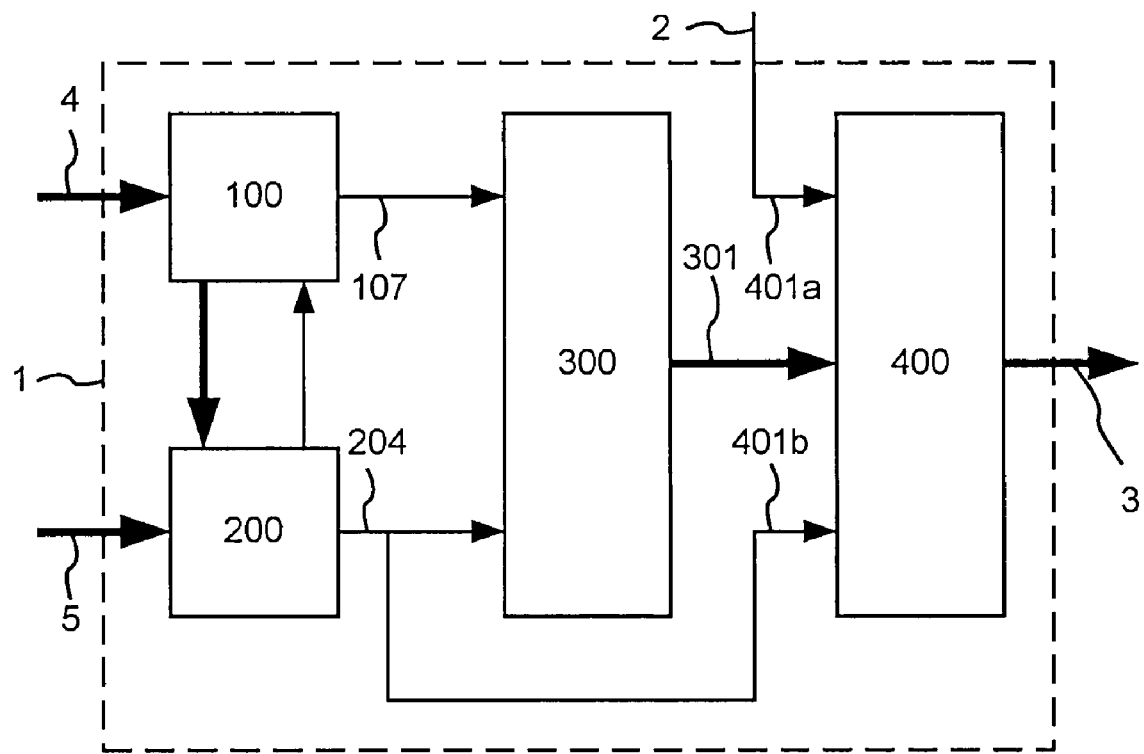
FIG. 1 is a block diagram of an analog-to-digital converter according to an embodiment.

An embodiment of an analog-to-digital converter (ADC) 1 with adjustable input range is illustrated with a block diagram in FIG. 1. The ADC 1 may e.g. be comprised in an integrated circuit. An analog input value may be supplied to an input terminal 2 of the ADC 1. The ADC 1 may be adapted to generate a digital output value of the ADC 1 on an output terminal 3.

The ADC 1 may comprise a first range-control unit 100 adapted to generate a first range-control value for controlling a size of the input range. The size may e.g. be the difference between the maximum and the minimum analog input value that may be converted by the ADC 1. The first range-control value may e.g. be presented at an output terminal 107 of the first range-control unit 100. The ADC 1 may further comprise a second range-control unit 200 adapted to generate a second range-control value. The second range-control value may e.g. be presented at an output terminal 204 of the second range-control unit 200. The second range-control value may e.g. be used for controlling a midpoint of the input range. The first range-control unit 100 may be operatively connected to the second range-control unit 200, e.g. for supplying at least one reference value to the second range-control unit 200. The first range-control unit 100 may be adapted to generate the at least one reference value. Further, a feedback path may be provided from the second range-control unit 200 to the first range-control unit 100. A more detailed description of the connections between the first range-control unit 100 and the second range control unit 200 will be given in the context of specific embodiments.

The ADC 1 may comprise a reference-level unit 300 adapted to generate a plurality of reference levels for the ADC 1 at least based on the first and the second range-control value. The reference-level unit 300 may be operatively connected to the first range-control unit 100 and to the second range-control unit 200.

The ADC 1 may comprise a comparison unit 400. The comparison unit 400 may have a differential input including a first input terminal 401a and a second input terminal 401b. A first analog value may be supplied to the first input terminal 401a of the comparison unit 400. The first analog value may be the analog input value supplied at the input terminal 2 of the ADC 1 or a value derived therefrom. A second analog value may be supplied to the second input terminal 401b of the comparison unit 400. The second analog value may be the second range-control value generated by the second range-control unit 200 or a value derived therefrom. The comparison unit 400 may be operatively connected to the reference-level unit 300, e.g. through a connection 301 for supplying the plurality of reference levels to the comparison unit. The connection 301 may include a plurality of sub connections, e.g. one sub connection for each of the plurality of reference levels.

The comparison unit 400 may be adapted to perform at least one comparison of a third analog value derived from the first and the second analog value with the plurality of reference levels. The third analog value may be the difference between the first analog value and the second analog value. The comparison unit 400 may further be adapted to generate a digital value on the terminal 3 based on the comparison. The digital value may be the digital output value of the ADC 1.

In order to obtain relatively small common-mode variations in the comparison unit 400 due to changes in the first and/or the second range-control value, the reference-level unit 300 may be adapted to generate the plurality of reference levels such that an average value of the reference levels is proportional to at least the second range-control value. This will be further described in the context of specific embodiments.

In an embodiment, at least one of the first range-control unit 100 and the second range-control unit 200 may be controlled via control interfaces of the ADC 1. For example, the first range-control unit 100 may be controlled via a first control interface 4. The first control-interface 4 may e.g. be a digital interface. Alternatively or additionally, the second range-control unit 200 may be controlled via a second control interface 5. The second control-interface 5 may e.g. be a digital interface. Further, at least one of the first range-control unit 100 and the second range-control unit 200 may include a digital-to-analog converter (DAC) adapted to generate an analog output value at least based on digital control values supplied via the first control interface 4 or the second control interface 5, respectively.

Figure 2:
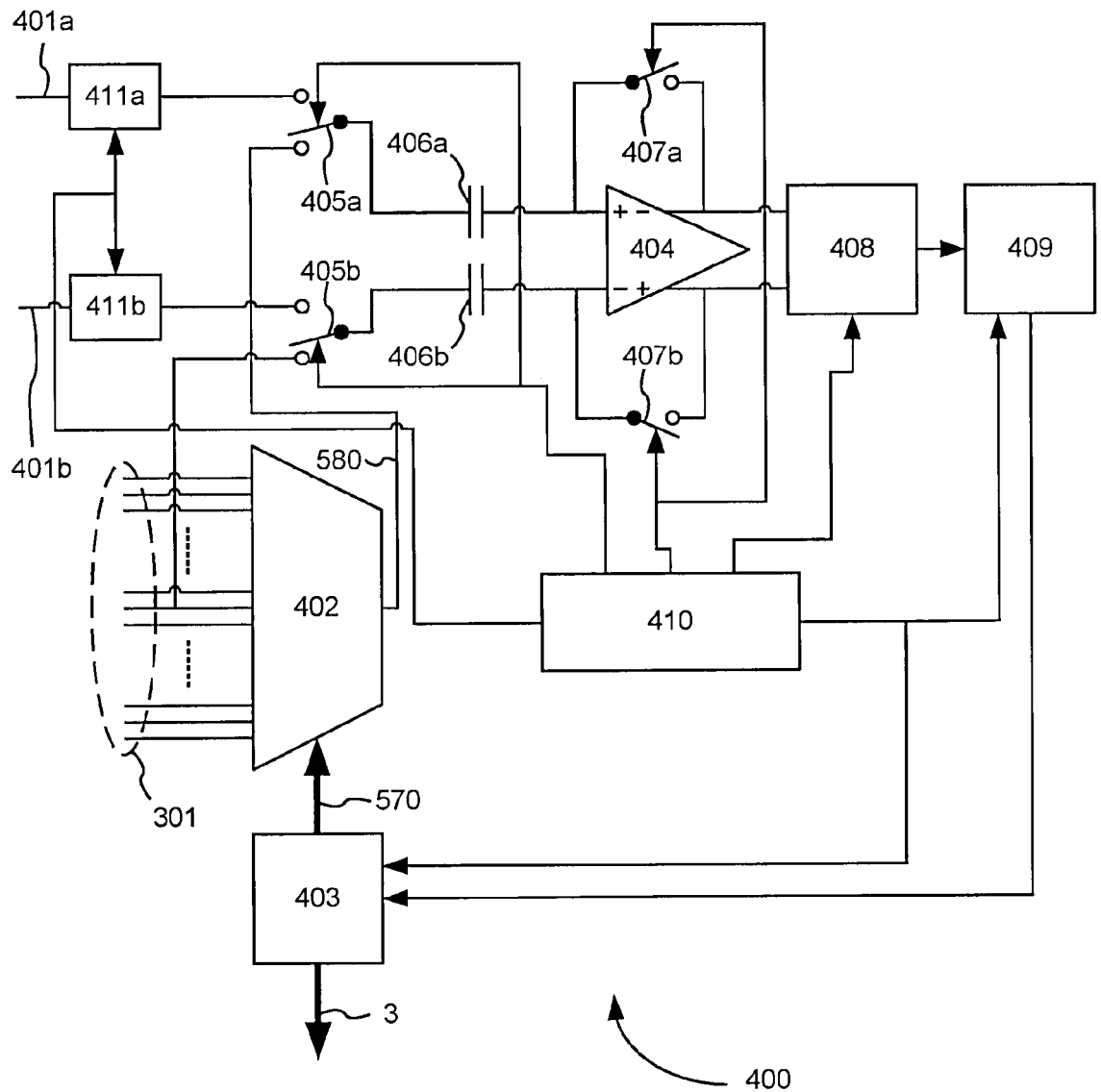
FIG. 2 is a block diagram of a comparison unit according to an embodiment.

An embodiment of the comparison unit 400 for performing A/D conversion with successive approximation (SA) is illustrated with a block diagram in FIG. 2. The first input terminal 401a may be connected to an input terminal of a first track and hold circuit 411a. The track and hold circuit 411a may include a level-shifting buffer, e.g. in the form of a common-drain stage. The second input terminal 401b may be connected to an input terminal of a second track and hold circuit 411b. In an embodiment, the second analog value at the second input terminal 401b is the second range-control value. This value may be constant during the A/D conversion and, therefore, the second track and hold circuit 411b may be omitted. However, it may be advantageous to include the second track and hold circuit 411b, e.g. for canceling of charge injection from the first track and hold circuit 411a.

During an auto-zero phase of the comparison unit 400, switches 405a and 405b may be set to connect the outputs of the first track and hold circuit 411a and the second track and hold circuit 411b to capacitors 406a and 406b, respectively. The capacitors 406a and 406b may have equal capacitance. The capacitors 406a and 406b may be connected to a positive input and a negative input, respectively, of a comparator 404. The comparator 404 may be fully differential, i.e. have a differential input and a differential output. Further, during the auto-zero phase, a positive output of the comparator 404 may be connected to the negative input of the comparator 404 and a negative output of the comparator 404 may be connected to the positive input of the comparator 404. These connections may be provided by closing switches 407a and 407b. During the auto-zero phase, the capacitors 406a and 406b may be charged such that a difference between the charges stored on the capacitors 406a and 406b is proportional to the difference between voltages presented at the outputs of the track and hold circuits 411a and 411b.

During a comparison phase of the comparison unit 400, the switch 405a may instead be set to connect the output of the multiplexer unit 402 to the capacitor 406a. Further, the switch 405b may be set to supply one of the reference levels provided over the connection 301 to the capacitor 406b. The reference level supplied to the capacitor 406b may e.g. be a reference level having a value equal or close to an average value of the plurality of reference levels. The switches 407a and 407b may be open during the comparison phase. A decision unit 408 may be connected to the comparator 404. The decision unit 408 may be adapted to convert a differential output of the comparator 404 either to a logic '0' or to a logic '1' based on e.g. the sign of the differential output. The decision unit 408 may be operatively connected to a delay unit 409, such as a D flip-flop, at an output of the decision unit 408. An output of the delay unit 409 may be connected to the control unit 403.

The control unit 403 may be adapted to control the multiplexer unit 402 based on the output from the delay unit 409 such that the comparison unit 400 performs a binary search of the plurality of reference levels for generating the digital output value of the ADC 1. The control unit 402 may control the multiplexer unit 402 by supplying a control word to the multiplexer unit 403 via a control interface 570. The control word may have a binary representation. An N-bit control word may be used for selecting one of $2^N$ reference levels. For example, the control unit 403 may start by setting a most significant bit (MSB) of the control word to '1' and the remaining bits to '0'. The multiplexer unit 402 may then output the corresponding reference level on an output terminal 580. The comparator 404 and the decision unit 408 may be used for comparing the difference between the reference levels supplied to the capacitors 406a and 406b via the switches 405a and 405b, respectively, with the differential input of the comparison unit, which is represented with the charges stored on the capacitors 406a and 406b during the auto-zero phase. If the differential input is larger than or equal to the difference in reference levels, the decision unit 408 may output a '1'. If the differential input is smaller than the difference in reference levels, the decision unit 408 may output a '0'. The output of the decision unit 408 may then be forwarded to the control unit 403. The MSB of the control word may then be set to the result of the comparison, i.e. '1' or '0', during remaining comparisons.

The control unit 403 may then proceed by setting a bit with the second highest significance in the control word to '1' and the multiplexer unit 402 may output the corresponding reference level. The comparator 404 and the decision unit 408 may then be used to perform a comparison similar to that described above, but with another reference level supplied to the capacitor 406a. This process may proceed until all N bits in the control word have been processed. The control unit 402 may be adapted to generate the digital output value of the ADC 1 and present it at the output terminal 3 of the ADC 1. The digital output value may be represented with the control word after all N bits of the control word have been processed. A clock unit 410 may be included in the comparison unit. The clock unit 410 may e.g. be adapted to provide clock signals for the switches 405a and 405b, the switches 407a and 407b, the decision unit 408, the delay unit 409, the track and hold circuits 411a and 411b, and/or the control unit 403. Alternatively, an external clock unit may be used.

The reference-level unit 300 (FIG. 1) may be adapted to generate the plurality of reference levels such that an average value of the reference levels is proportional to at least the second range-control value. Thereby, the plurality of reference levels may have an average value which is equal to or close to the common-mode level of the output signals from the track and hold circuits 411a and 411b. Thereby, a large shift in common mode value at the inputs of the comparator 404 when states of switches 405a and 405b are changed from connecting the capacitors 406a and 406b to the outputs of the track and hold circuits 411a and 411b to instead connecting the capacitors 406a and 406b to the respective reference levels may be avoided. Hence, the requirement on common-mode rejection ratio (CMRR) in the comparator 404 may be reduced compared with e.g. if a fixed set of reference levels were used. Consequently, the flexibility in input range of the ADC 1 may be improved.

Different types of comparison units 400 other than the SA comparison unit described above are possible within the scope of the invention. For example, the comparison unit may have the structure of a parallel SA ADC (PSA-ADC), where a plurality of comparison units sharing the same set of reference levels and performing SA A/D conversion may be used in a time-interleaved fashion. Alternatively, a comparison unit 400 performing flash A/D conversion may be used, e.g. where one comparator is assigned to each reference level and the output may be generated with a thermometer-coded representation. Another alternative embodiment for the comparison unit 400 is to employ a pipelined structure where the conversion takes place in several stages. The reference-level unit may then e.g. be used for generating reference levels for the first stage in the pipelined structure. Reference levels for the following stages may e.g. be generated internally in the comparison unit 400.

Figure 3:
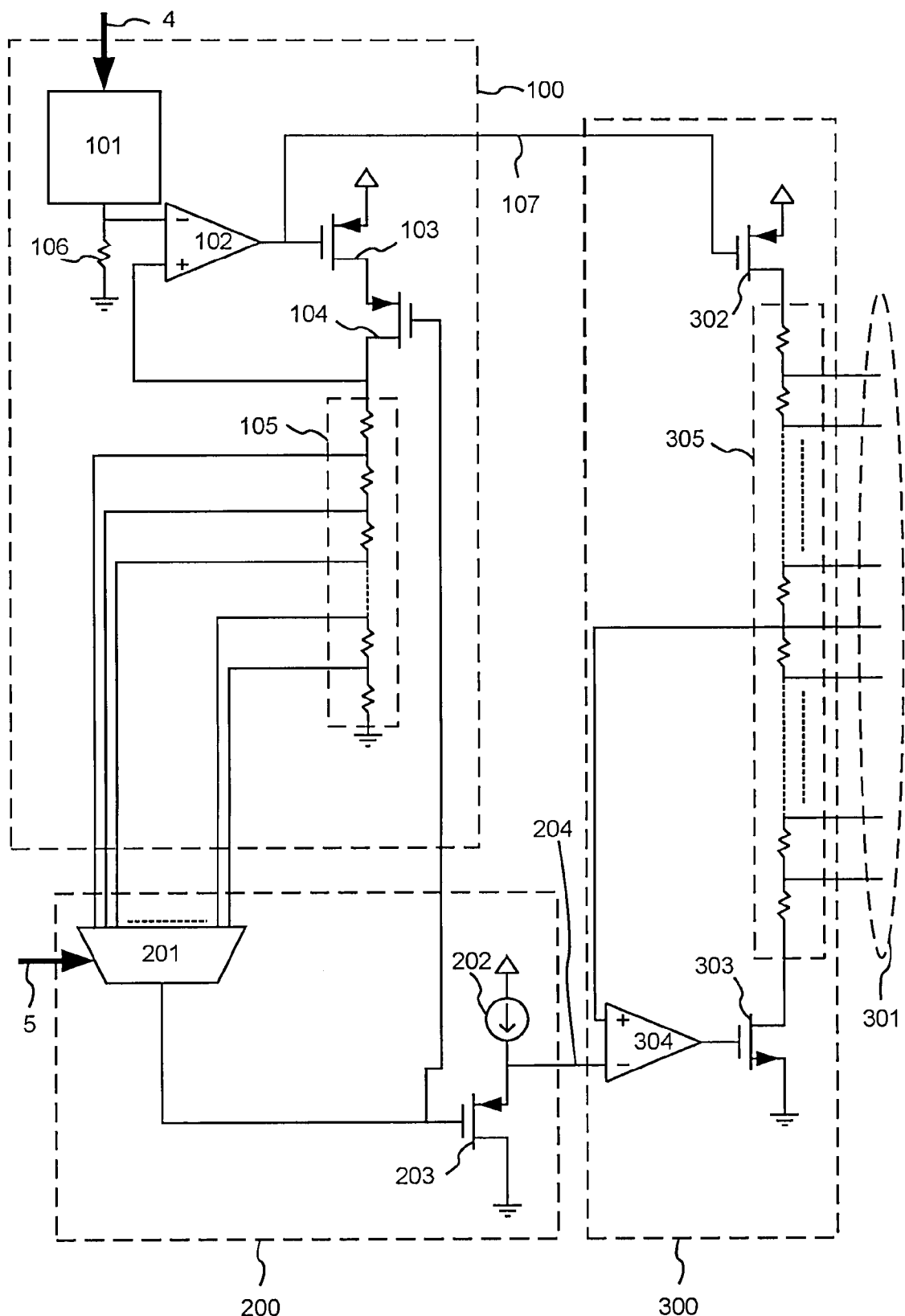
FIG. 3 is a circuit diagram of a first range-control unit, a second range-control unit, and a reference-level unit according to an embodiment.

Embodiments of the first range-control unit 100, the second range-control unit 200, and the reference-level unit 300 are illustrated with a schematic circuit diagram in FIG. 3. The first range-control unit 100 may include a current unit 101. The current unit 101 may be a digitally controllable current unit, such as a current-steering digital-to-analog converter (DAC). An output current of the current unit 101 may be controllable via the first control interface 4. The current unit 101 may have an associated load resistor 106.

A voltage across the load resistor 106 may be supplied to a negative input of an operational amplifier (OP) 102. An operational transconductance amplifier (OTA) may alternatively be used instead of the OP 102. The gate terminal of a PMOS transistor 103 may be connected to an output terminal of the OP 102. The source terminal of the PMOS transistor 103 may be connected to a supply voltage ($V_{DD}$). The drain terminal of the PMOS transistor 103 may be connected via a PMOS transistor 104 to a resistor string 105. In an alternative embodiment, the drain terminal of the PMOS transistor 103 may be connected directly to the resistor string 105. In further alternative embodiments, at least one cascode transistor may be connected between the PMOS transistor 103 and the resistor string 105. The resistor string 105 may be adapted to generate the at least one reference value for the second range-control unit 200.

The OP 102 may be connected in a feedback configuration where a positive input terminal of the OP 102 may be connected to the resistor string 105. Such a feedback configuration may ensure that the PMOS transistor 103 generates a current such that the voltage across the resistor string 105 equals or approximately equals the voltage across the load resistor 106. The first range-control value presented at the output terminal 107 may be the voltage at the output terminal of the OP 102. In alternative embodiments, other types of DACs than a current-steering DAC, such as but not limited to a resistor-string DAC, an R-2R ladder DAC, or a charge-redistribution DAC, may be used for controlling a voltage at the negative input of the OP 102.

The second range-control unit 200 may include a multiplexer unit 201. The multiplexer unit 201 may be adapted to select one of the at least one reference values supplied by the first range-control unit 100 based on a control signal. The control signal may be a digital control signal. The control signal may be supplied through the second control interface 5. The multiplexer unit 201 may further be adapted to present the selected reference value at an output terminal of the multiplexer unit 201.

If the track and hold circuit 411a (FIG. 2) includes a level-shifting buffer, e.g. in the form of a common-drain stage, the second range-control unit 200 may also include a level-shifting buffer. The level-shifting buffer in the second range-control unit 200 may e.g. be in the form of a common-drain stage including a PMOS transistor 203 biased with a current source 202. The level-shifting buffer in the second range-control unit 200 may be identical to the level-shifting buffer in the first track and hold circuit 411a (FIG. 2), e.g. in order to compensate for an offset voltage introduced by the level-shifting buffer in the first track and hold circuit 411a. The second range-control value presented at the output terminal 204 may be an output voltage of the level-shifting buffer in the second range-control unit 200. The output voltage may be the voltage at the drain terminal of the PMOS transistor 203. Alternatively, e.g. if the first track and hold circuit 411a does not include a level-shifting buffer, the level-shifting buffer in the second range-control unit 200 may be omitted. The second range-control value presented at the output terminal 204 may then be the output voltage of the multiplexer unit 201.

The reference-level unit 300 may comprise a PMOS transistor 302. The source terminal of the PMOS transistor 302 may be connected to $V_{DD}$. The drain terminal of the PMOS transistor 302 may be connected to a first end of a resistor string 305. Alternatively, at least one cascode transistor may be connected between the PMOS transistor 302 and the resistor string 305. The resistor string 305 may be adapted to generate the plurality of reference levels for the ADC 1. The resistor string 305 may comprise a plurality of resistors. All of the plurality of resistors may have equal resistance.

The reference-level unit 300 may further comprise an NMOS transistor 303. The source terminal of the NMOS transistor may be connected to ground. The drain terminal of the NMOS transistor 303 may be connected to a second end of the resistor string 305. The gate terminal of the NMOS transistor 303 may be connected to an output of an OP 304. Alternatively, an OTA may be used instead of the OP 304. A negative input terminal of the OP 304 may be connected to the output terminal 204 of the second range-control unit 200. The OP 304 may be connected in a feedback configuration where a positive input terminal of the OP 304 may be connected to an internal node of the resistor string 305. Such a feedback configuration may ensure that a voltage of the internal node equals or approximately equals the second range-control value. The internal node may be a node in the middle of the resistor string 305. Then, e.g. if all the resistors in the resistor string have equal resistances, the voltage of the internal node may be an average value of the plurality of reference levels generated by the reference-level unit 300. Hence, the second range-control value may be used to control the average value of the plurality of reference levels generated by the reference-level unit 300.

The gate terminal of the PMOS transistor 302 may be connected to the output terminal 107 of the first range-control unit 100. With this arrangement, the PMOS transistor 302 is given the same source-to-gate voltage ($V_{SG}$) as the PMOS transistor 103. Therefore, the PMOS transistor 302 may mirror the drain current of the PMOS transistor 103. Using cascode transistors connected to the PMOS transistor 302 and/or the PMOS transistor 103 may be advantageous for obtaining accurate mirroring of the drain current of the PMOS transistor 302. The drain current of the PMOS transistor 103 may be proportional to the current generated by the current unit 101. Therefore, the drain current of the PMOS transistor 302 may also be proportional to the current generated by the current unit 101. The size of the input range may be determined by the difference between the highest and the lowest of the plurality of reference levels. This difference may be proportional to the drain current of the PMOS transistor 302 with a proportionality factor determined by a sum of resistances in the resistor string according to Ohm's law. Hence, the size of the input range may be controlled by the first range-control value.

The PMOS transistor 104 in the first range-control unit 100 may be connected at its gate terminal to the output of the multiplexer unit 201 in the second range-control unit 200, e.g. via the feedback path between the second range-control unit 200 and the first range-control unit 100. This may be advantageous for reducing variations in source-to-drain voltage ($V_{SC}$) of the PMOS transistor 103, which in turn may improve the accuracy of the mirroring of the drain current of the PMOS transistor 103 which is performed by the PMOS transistor 302.

Figure 4:
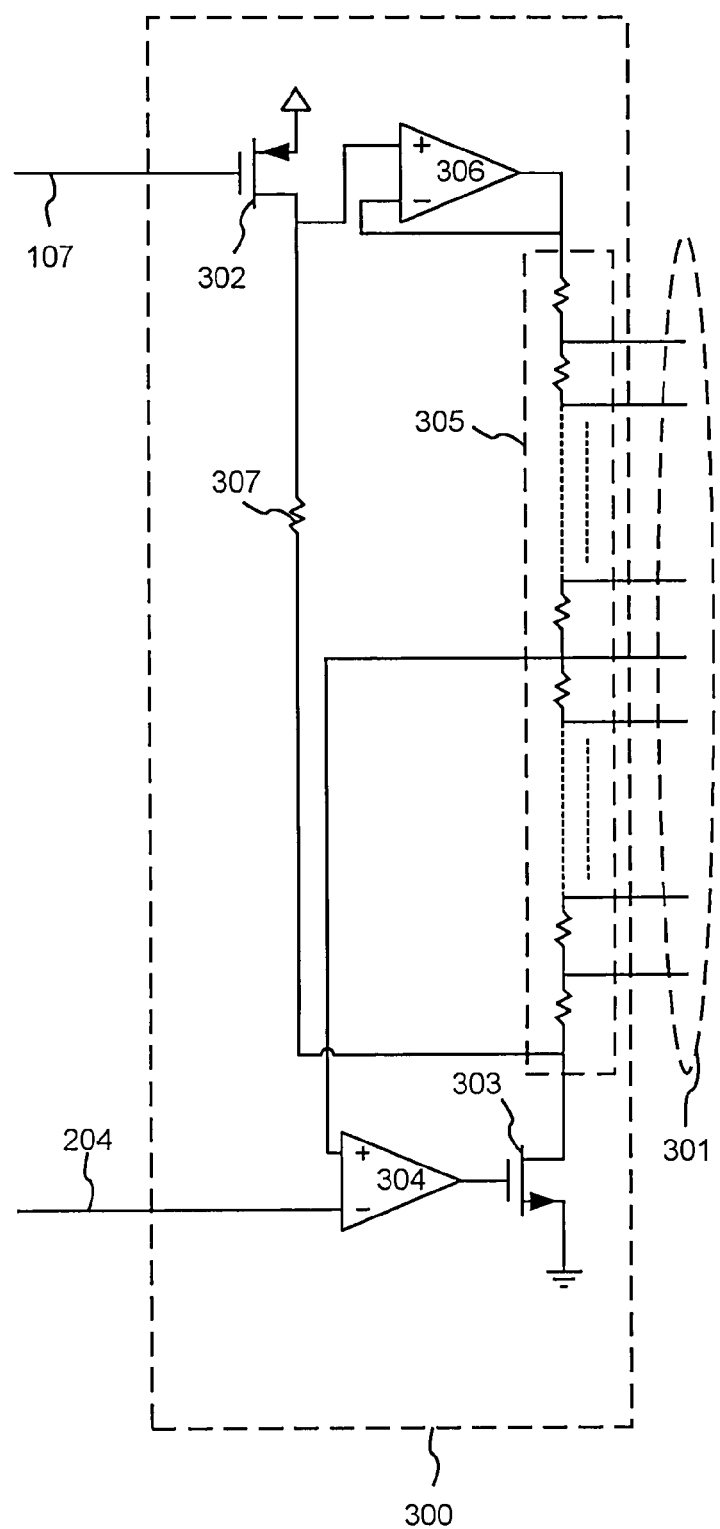
FIG. 4 is a circuit diagram of an alternative embodiment of a reference-level unit.

A schematic circuit diagram of an alternative embodiment of the reference-level unit 300 is shown in FIG. 4. Instead of being directly fed into the resistor string 305, the drain current of the PMOS transistor 302 may instead be fed into a first terminal of a resistor 307. Alternatively, at least one cascode transistor may be connected between the PMOS transistor 302 and the resistor 307. The resistor 307 may in turn be connected at a second terminal to the second end of the resistor string 305. A positive input terminal of an OP 306 may be connected to the first terminal of the resistor 307. The OP 306 may be connected in a source-follower configuration, e.g. have an output terminal connected to a negative input terminal. The output terminal of the OP 306 may be connected to the first end of the resistor string 305. With this configuration, a voltage drop across the resistor string 305 may be equal to a voltage drop across the resistor 307. Therefore, as for the embodiment of FIG. 3, the size of the input range may be controlled by the first range-control value. Internal nodes of the resistor string 305 may be connected to switches e.g. in the multiplexer unit 402 (FIG. 2) of the comparison unit 400. The switches may e.g. be realized with MOS transistors. Switching activity in the switches may induce disturbances in the reference levels generated in the resistor string 305. Feeding the resistor string via the OP 306 instead of directly from the PMOS transistor 302 may be advantageous for reducing the disturbances resulting from such switching activity since the OP 306 may have a lower output resistance than the PMOS transistor 302.

Figure 5:
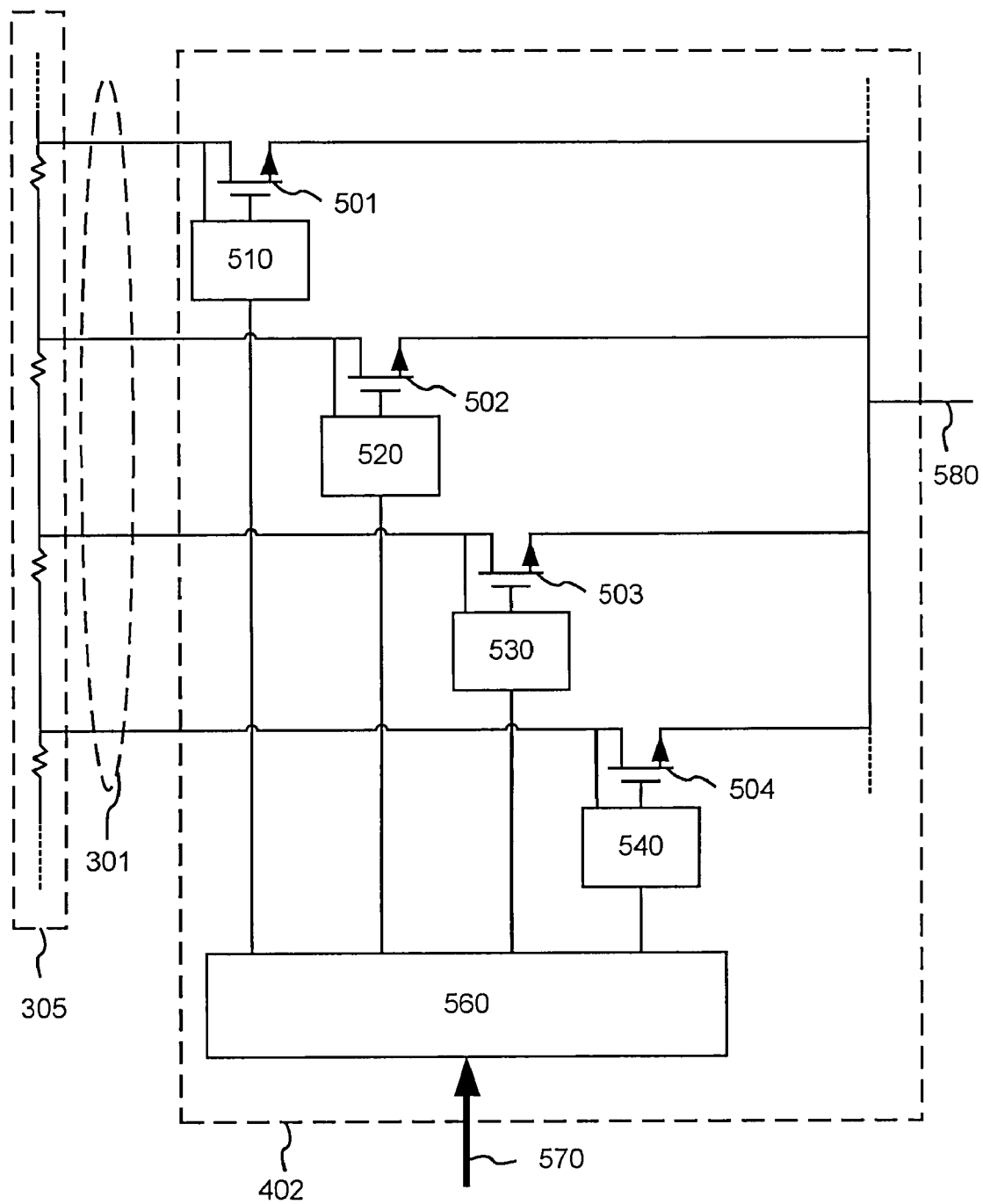
FIG. 5 is a circuit diagram of a multiplexer unit according to an embodiment.

An embodiment of the multiplexer unit 402 (FIG. 2) is illustrated with a schematic circuit diagram in FIG. 5. The resistor string 305 adapted to generate the plurality of reference levels is also included in FIG. 5 to put the multiplexer unit 402 in a context. The multiplexer unit 402 may comprise a plurality of switch devices, four of which are shown in FIG. 5, embodied with NMOS transistors 501, 502, 503, 504. Alternatively, at least one of the switch devices may be implemented e.g. with a PMOS transistor or a transmission gate.

The multiplexer unit 402 will in the following be described with embodiments where the switch devices are implemented with NMOS transistors 501, 502, 503, 504. Each of the plurality of switch devices may be connected to a unique internal node of the resistor string 305. To the NMOS transistors 501, 502, 503, 504, there may be associated switch-control units 510, 520, 530, 540, respectively. The switch-control units 510, 520, 530, 540 may be connected to the gate terminals of the NMOS transistors 501, 502, 503, 504, respectively. In some embodiments, the switch-control units 510, 520, 530, 540 may additionally be connected to the internal nodes of the resistor string that are connected to the NMOS transistors 501, 502, 503, 504, respectively, as indicated in FIG. 5. The switch-control units 510, 520, 530, 540 may be adapted to generate control voltages for controlling states of the NMOS transistors 501, 502, 503, 504, respectively. The state of an NMOS transistor 501, 502, 503, 504 may e.g. be one of a conducting state and a nonconducting state. The control voltage may be generated based on a control signal supplied by a decoder unit 560. The decoder unit 560 may be adapted to generate control signals for the switch-control units 510, 520, 530, 540 based on a control word supplied via the control interface 570.

The control word may be supplied by the control unit 403 (FIG. 2).

The control signals may be such that one and only one of the NMOS transistors 501, 502, 503, 504 is in a conducting state. The control word may e.g. be in an N-bit binary representation. The decoder unit may then be adapted to select exactly one of $2^N$ NMOS transistors 501, 502, 503, 504 to be set in a conducting state. The reference level at the internal node of the resistor string 305 that is connected to the one of the NMOS transistors 501, 502, 503, 504 that is set in a conducting state may then be forwarded to the output terminal 580 of the multiplexer unit 402.

In the following, control of the NMOS transistor 501 will be discussed. Similar reasoning is valid for the other NMOS transistors 502, 503, 504. In an embodiment, a first fixed voltage may be supplied to the gate terminal of the NMOS transistor 501 for setting the NMOS transistor 501 in the conducting state. The first fixed voltage may e.g. be $V_{DD}$. Further, a second fixed voltage may be supplied to the gate terminal for setting the NMOS transistor 501 in the nonconducting state. The second fixed voltage may e.g. be 0 V. The first and the second fixed voltage may be generated directly by the decoder unit 560 based on the control word. Hence, the switch-control unit 510 may be realized with a short circuit between the decoder unit 560 and the gate terminal of the NMOS transistor 501. Since the NMOS transistors 501, 502, 503, 504 are supplied with different reference levels from the resistor string 305, they will have different source potentials when operating in the conducting state. As a consequence, they may have different on resistances, e.g. if they are equally sized. Different on resistances may in turn cause nonlinearity errors in the ADC 1. If the reference levels generated by the resistor string 305 are fixed, the effects of having different source potential for different NMOS transistors 501, 502, 503, 504 may be compensated for, at least in part, by assigning different with-over-length ratios (W/L) to the different NMOS transistors 501, 502, 503, 504.

However, if the generated reference levels are not fixed, e.g. if the generated reference levels may vary with the first and/or second range-control value, assigning different W/L to the different NMOS transistors 501, 502, 503, 504 may be less efficient for compensating for different source potentials of the NMOS transistors 501, 502, 503, 504.

Figure 6A:
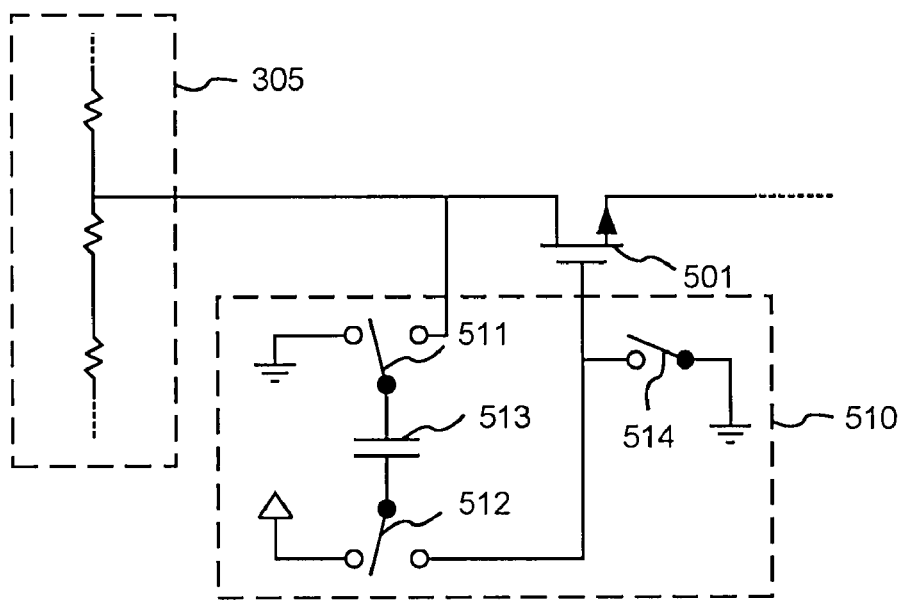
FIGS. 6a-c are circuit diagrams of a switch device and a switch-control unit in a multiplexer unit according to an embodiment.

An embodiment of the switch-control unit 510 that may be used for reducing the effects of different source potential is illustrated with a schematic circuit diagram in FIG. 6a. The switch-control unit 510 may include switches 511, 512, and 514. The switch-control unit 513 may further include a capacitor 513. The switch 511 may be arranged to selectively connect a first terminal of the capacitor 513 either to ground or to the internal node of the resistor string 305 that is connected to the NMOS transistor 501 based on the control signal generated by the decoder unit 560 (FIG. 5). The switch 512 may be adapted to selectively connect a second terminal of the capacitor 513 either to $V_{DD}$ or to the gate terminal of the NMOS transistor 501 based on the control signal generated by the decoder unit 560 (FIG. 5). The switch 514 may be adapted to connect the gate terminal of the NMOS transistor 501 to ground when closed based on the control signal generated by the decoder unit 560.

Figure 6B:
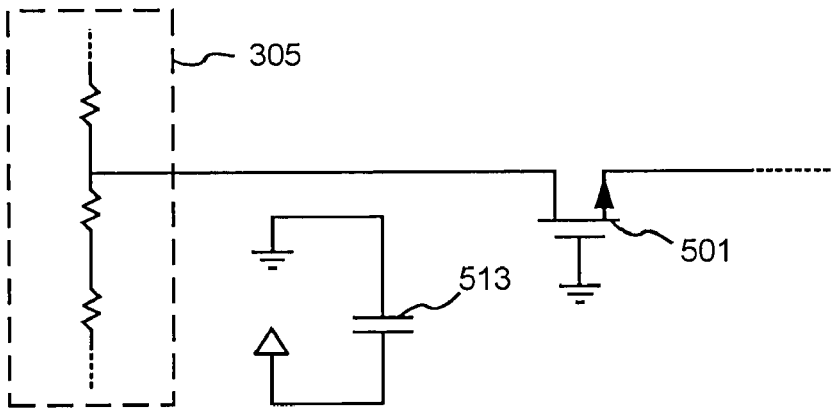

FIG. 6b shows a simplified schematic circuit diagram of the embodiment of FIG. 6a for the case where the NMOS transistor 501 is set in the nonconducting state. The switch 514 may be closed for connecting the gate terminal of the NMOS transistor 501 to ground and setting the NMOS transistor 501 in the nonconducting state. The switch 511 may be set to connect the first terminal of the capacitor 513 to ground and the switch 512 may be set to connect the second terminal of the capacitor 513 to $V_{DD}$. Hence, the capacitor 513 may be charged to $V_{DD}$. In alternative embodiments, fixed voltages other than $V_{DD}$ and ground may be used for charging the capacitor 513.

Figure 6C:
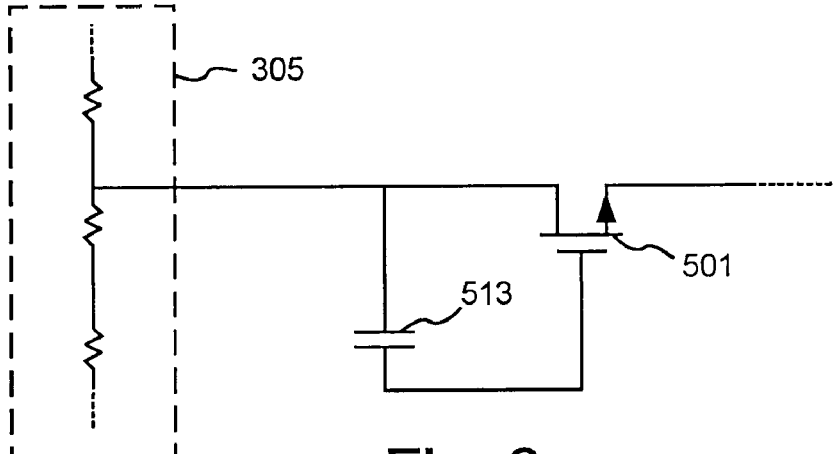

FIG. 6c shows another simplified schematic circuit diagram of the embodiment of FIG. 6a for the case where the NMOS transistor 501 is set in the conducting state. The switch 514 may be open. The switches 511 and 512 may be set to connect the capacitor 513 between the internal node of the resistor string 305 that is connected to the NMOS transistor 501 and the gate terminal of the NMOS transistor 501. The capacitor 513 may have a capacitance which is significantly larger than a channel capacitance of the NMOS transistor 501. Then, the voltage across the capacitor 513 may remain close to $V_{DD}$. As a consequence, the gate-to-source voltage ($V_{GS}$) of the NMOS transistor 501 will be close to $V_{DD}$ irrespective of the voltage level at the internal node of the resistor string 305 that is connected to the NMOS transistor 501. Using such an arrangement for controlling the states of the NMOS transistors 501, 502, 503, 504 may reduce errors due to different source potentials for the NMOS transistors 501, 502, 503, 504.

In an alternative embodiment, the capacitor 513 (FIG. 6a) may be implemented with an NMOS transistor (not shown), which has its drain terminal shorted to its source terminal. The gate terminal of said NMOS transistor may be connected to the switch 512 and the drain and source terminals may be connected to the switch 511. With this configuration, compensation for varying threshold voltage ($V_T$) in the NMOS transistor 501 due to variation in source potential may be obtained. The NMOS transistor with which the capacitor 513 is implemented will be given the same $V_T$ as the NMOS transistor 501 when the switch 511 is set to connect these NMOS transistors to each other. Therefore, a fraction, which is determined by the areas of the NMOS transistor with which the capacitor 513 is implemented and the NMOS transistor 501, of the charge stored in the capacitor 513 during the phase shown in FIG. 6b will be redistributed to the channel of the NMOS transistor 501 in the phase shown in FIG. 6c. For example, if the two NMOS transistor are equally sized, half of the stored charge will be redistributed to the channel of the NMOS transistor 501 in the phase shown in FIG. 6c. Thereby, the NMOS transistors 501, 502, 503, 504, will all be given the same on resistance regardless of to which node in the resistor ladder 305 they are connected. This is advantageous for obtaining an overall high linearity for the ADC 1.

Specific embodiments of the invention implemented in MOS technology have been presented. In alternative embodiments, other types of technologies may be used. For example, bipolar or BiCMOS technologies may be used, wherein at least part of the ADC 1 may be implemented with bipolar junction transistors (BJTs). Further, other embodiments are possible within the scope of the invention. For example, designs complementary to those presented in the embodiments may be used, where e.g. NMOS transistors may be replaced with PMOS transistors, PMOS transistors may be replaced with NMOS transistors, connections to ground may be replaced with connections to $V_{DD}$, and connections to $V_{DD}$ may be replaced with connections to ground.

The ADC 1 may be comprised in an integrated circuit. The ADC 1 may further be comprised in an electronic apparatus. The electronic apparatus may be, but is not limited to, any of a monitor, such as a VGA monitor, a projector, a television set, or a radio transceiver.

The present invention has been described above with reference to specific embodiments. However, other embodiments than the above described are possible within the scope of the invention. The different features of the invention may be combined in other combinations than those described. The scope of the invention is only limited by the appended patent claims.

The invention claimed is:

1. An analog-to-digital converter, comprising:
   a first range-control unit adapted to generate a first range-control value for controlling a size of an input range of the analog-to-digital converter;
   a second range-control unit adapted to generate a second range-control value for controlling an average value of a plurality of reference levels;
   a reference-level unit operatively connected to the first range-control unit and the second range-control unit, wherein the reference-level unit is arranged to generate the plurality of reference levels at least based on the first and the second range-control value; and
   a comparison unit operatively connected to the second range-control unit and the reference-level unit, wherein the comparison unit is arranged to perform at least one comparison between a difference between an analog input value of the analog-to-digital converter and the second range-control value and individual reference levels of the plurality of reference levels, and to generate a digital output value of the analog-to-digital converter based on the at least one comparison.

2. The analog-to-digital converter according to claim 1, wherein the first range-control value controls a difference between a largest reference level and a smallest reference level of the plurality of reference levels.

3. The analog-to-digital converter according to claim 1, wherein the average value of the plurality of reference levels is proportional to the second range-control value.

4. The analog-to-digital converter according to claim 1, wherein the first range-control unit is digitally controllable via a first control interface and/or the second range-control unit is digitally controllable via a second control interface of the analog-to-digital converter.

5. The analog-to-digital converter according to claim 4, wherein the first range-control unit includes a first MOS transistor, a digital-to-analog converter operatively connected to the first MOS transistor, and a first resistor string, and wherein the first range-control unit is arranged to generate the first range-control value on the gate terminal of the first MOS transistor, the digital-to-analog converter is arranged to control a drain current of the first MOS transistor, the first MOS transistor is arranged to inject said drain current into the first resistor string, and the first resistor string is arranged to generate at least one reference value for the second range-control unit.

6. The analog-to-digital converter according to claim 5, wherein the second range-control unit includes a multiplexer unit arranged to select one of the at least one reference value generated by the first resistor string, and wherein the second range-control unit is further adapted to output the selected one of the at least one reference value or a value derived therefrom.

7. The analog-to-digital converter according to claim 1, wherein the reference-level unit includes a second resistor string arranged to generate the plurality of reference levels at least based on a reference current injected into the second resistor string.

8. The analog-to-digital converter according to claim 7, wherein the reference-level unit further includes a second MOS transistor arranged to receive the first range-control value at the gate terminal and to generate the reference current based on the first range-control value.

9. The analog-to-digital converter according to claim 7, wherein the reference-level unit further includes an operational amplifier, OP, or operational transconductance amplifier, OTA, arranged to receive the second range-control value at a first input terminal of the OP or OTA and to supply a control voltage to the gate terminal of a third MOS transistor connected to the second resistor string, and wherein a second input terminal of the OP or OTA is connected to an internal node of the second resistor string.

10. An integrated circuit comprising an analog-to-digital converter according to claim 1.

11. An electronic apparatus comprising an analog-to-digital converter according to claim 1.

12. The electronic apparatus according to claim 11, wherein the electronic apparatus is a monitor, a projector, a television set, or a radio transceiver.

13. The analog-to-digital converter according to claim 1, wherein the second range-control value for controlling the average value of the plurality of reference levels is digitally controllable via a control interface of the analog-to-digital converter.

14. The analog-to-digital converter according to claim 13, wherein the control interface is a first control interface, and wherein the first range-control value for controlling the size of the input range of the analog-to-digital converter is digitally controllable via a second control interface of the analog-to-digital converter.

15. An analog-to-digital converter, comprising:
   a first range-control unit adapted to generate a first range-control value for controlling a size of an input range of the analog-to-digital converter;
   a second range-control unit adapted to generate a second range-control value for controlling a midpoint of the input range;
   a reference-level unit operatively connected to the first range-control unit and the second range-control unit, wherein the reference-level unit is arranged to generate a plurality of reference levels at least based on the first and the second range-control value; and a comparison unit operatively connected to the second range-control unit and the reference-level unit, the comparison unit including at least one multiplexer unit arranged to select one of the plurality of reference levels and to forward the selected one of the plurality of reference levels to an output terminal of the at least one multiplexer unit, wherein the comparison unit is arranged to perform at least one comparison between a difference between an analog input value of the analog-to-digital converter and the second range-control value and individual reference levels of the plurality of reference levels, and to generate a digital output value of the analog-to-digital converter based on the at least one comparison.

16. The analog-to-digital converter according to claim 15, wherein the at least one multiplexer unit in the comparison unit includes a plurality of MOS transistors arranged to forward one of the plurality of reference levels to the output of the multiplexer unit when set in a conducting state.

17. The analog-to-digital converter according to claim 16, wherein each of the plurality of MOS transistors is operatively connected to a switch-control unit, and wherein each switch-control unit is adapted to set the MOS transistor operatively connected to it in the conducting state by connecting a charged capacitor to said MOS transistor.

\* \* \* \* \*